United States Patent [19]

Shinohe et al.

[11] Patent Number: 5,210,432
[45] Date of Patent: May 11, 1993

[54] INSULATED GATE GTO THYRISTOR

[75] Inventors: Takashi Shinohe, Yokohama; Masaki Atsuta, Yokosuka; Akio Nakagawa, Hiratsuka, all of Japan

[73] Assignee: Kabushiki Kaisha Toshiba, Kawasaki, Japan

[21] Appl. No.: 615,252

[22] Filed: Nov. 19, 1990

[30] Foreign Application Priority Data

Nov. 30, 1989 [JP] Japan .................. 1-311372

[51] Int. Cl.⁵ .............. H01L 29/74; H01L 29/747; H01L 29/10
[52] U.S. Cl. .................. 257/152; 257/128; 257/123; 257/147; 257/139
[58] Field of Search ............ 357/38, 38 C, 38 E, 357/39, 23.4, 23.3; 257/139, 128, 123, 147, 152

[56] References Cited

U.S. PATENT DOCUMENTS

| | | | |
|---|---|---|---|
| 4,604,638 | 8/1986 | Matsuda | 357/23.4 |
| 4,684,413 | 8/1987 | Goodman et al. | 357/38 |
| 4,717,940 | 1/1988 | Shirohe et al. | 357/38 |
| 4,866,315 | 9/1989 | Ogura et al. | 357/38 |
| 4,954,869 | 9/1990 | Bauer | 357/38 |
| 4,959,703 | 9/1990 | Ogura et al. | 357/38 |
| 4,969,028 | 11/1990 | Baliga | 357/38 |

FOREIGN PATENT DOCUMENTS

| | | |
|---|---|---|
| 0280536 | 3/1988 | European Pat. Off. . |
| 3447220 | 7/1985 | Fed. Rep. of Germany . |
| 0154049 | 2/1982 | German Democratic Rep. . |
| 0214470 | 9/1986 | Japan .................. 357/38 |
| 63-53972 | 3/1988 | Japan . |
| 63-209169 | 8/1988 | Japan . |
| 63-224360 | 9/1988 | Japan . |

OTHER PUBLICATIONS

IEEE Transactions on Electron Devices, vol. ED-32, No. 3, Mar. 1985, S. Hachad et al. "Latchup Criteria in Isulated Gate p-n-p-n Structures".

Primary Examiner—Rolf Hille
Assistant Examiner—Wael Fahmy
Attorney, Agent, or Firm—Oblon, Spivak, McClelland, Maier & Neustadt

[57] ABSTRACT

According to this invention, there is disclosed an insulated gate GTO thyristor comprising a pnpn structure including a p-type emitter layer, an n-type base layer, a p-type base layer, and an n-type emitter layer. The thyristor has a first gate electrode contacting the p-type base layer and a second gate electrode formed on a channel region of the p-type base layer through a gate insulating film. An n+-type layer of the n-type emitter layer immediately below a cathode electrode and an n−-type layer of the n-type emitter layer contacting the channel region are formed in different manufacturing steps, and an emitter breakdown voltage and the threshold voltage of the second gate electrode are optimally set.

14 Claims, 11 Drawing Sheets

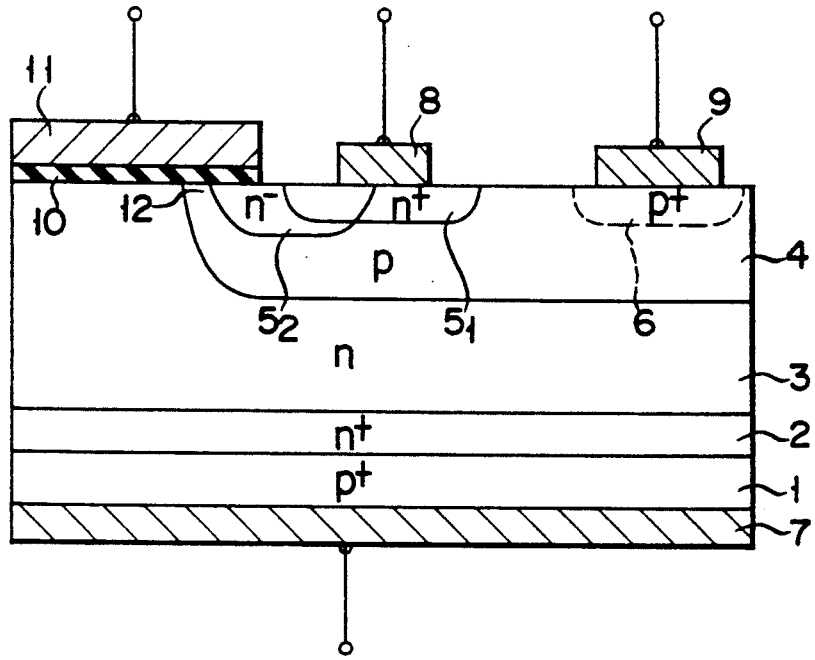
F I G. 5
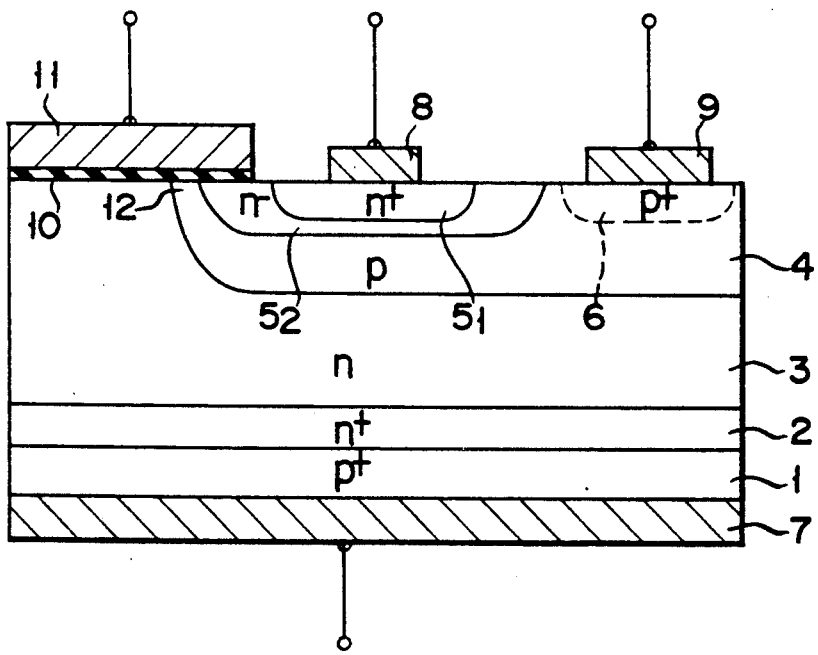
F I G. 6

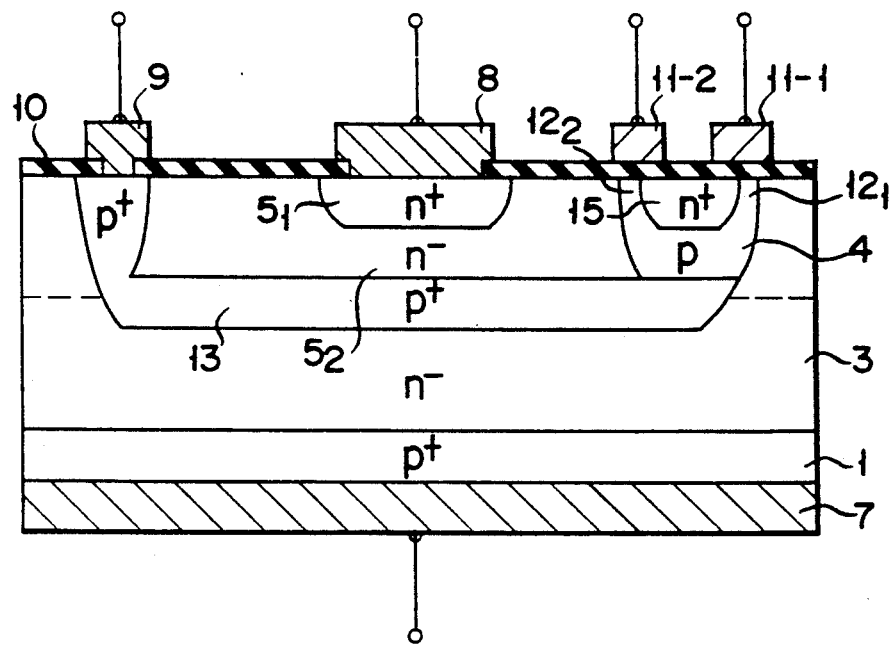
F I G. 13
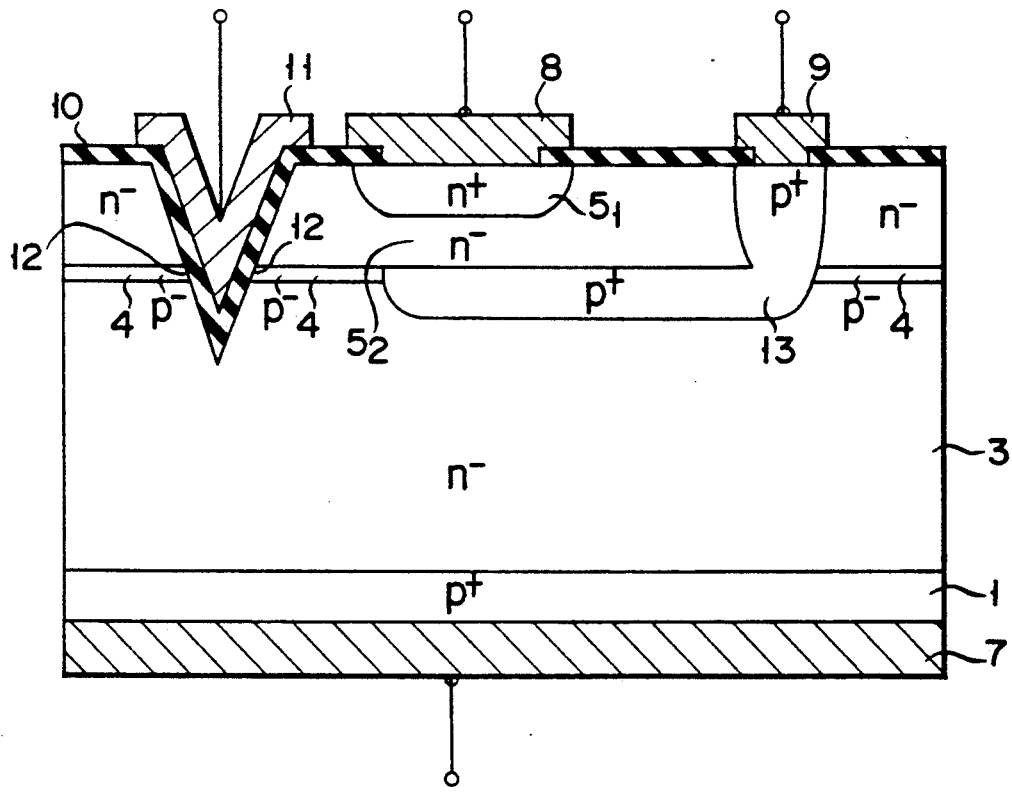
F I G. 14

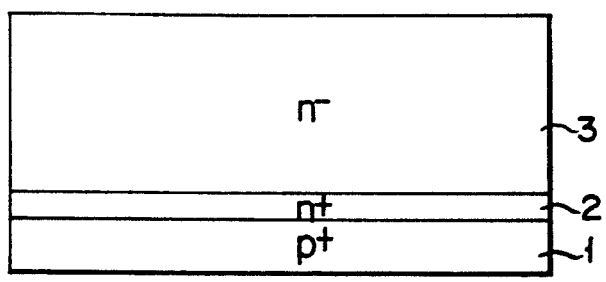
F I G. 15A
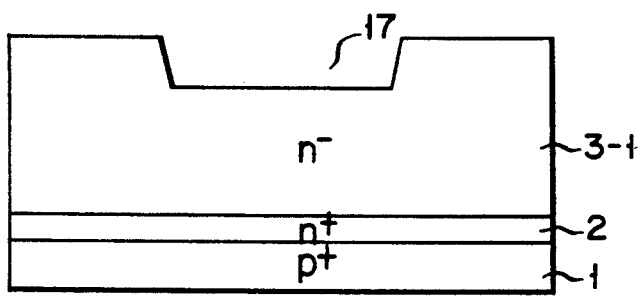
F I G. 15B
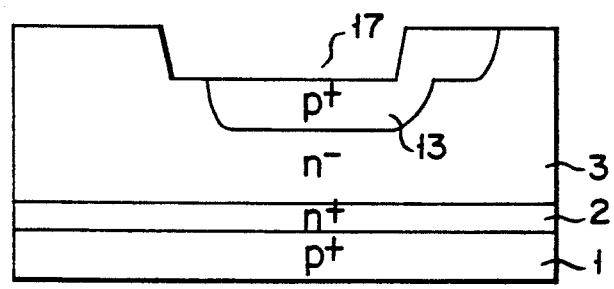
F I G. 15C
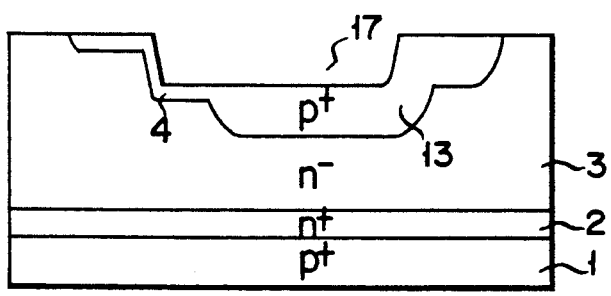
F I G. 15D
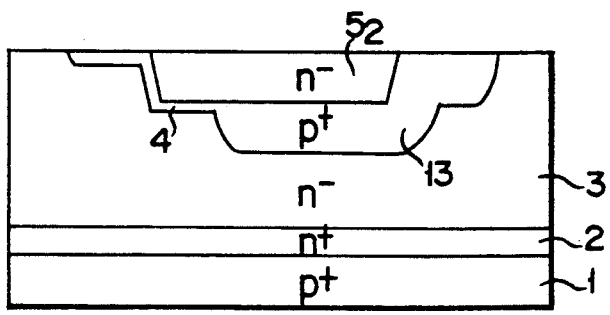
F I G. 15E

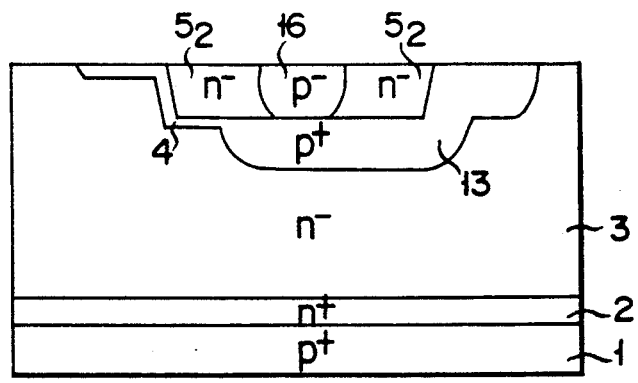
F I G. 15F
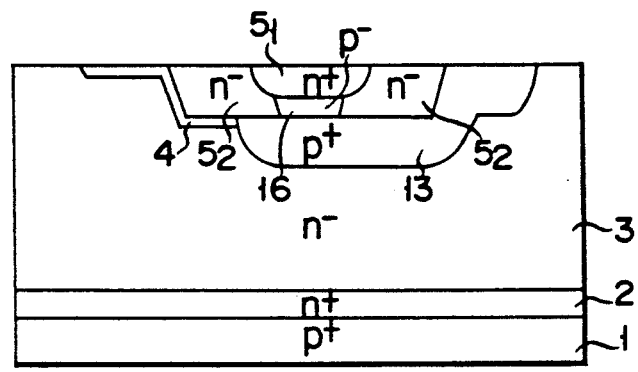
F I G. 15G
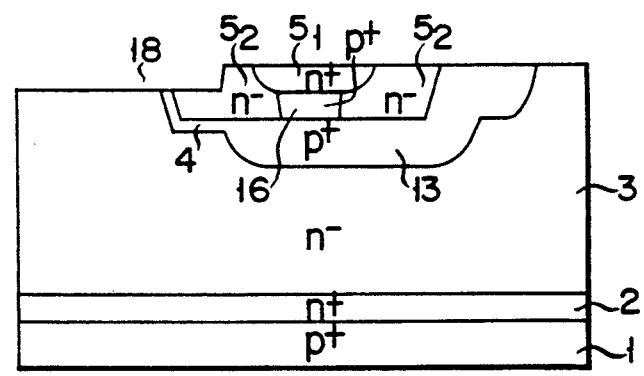
F I G. 15H
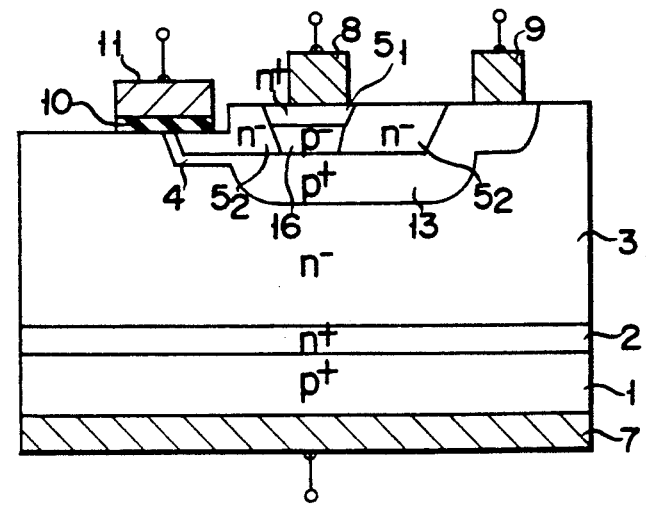
F I G. 15I

1

INSULATED GATE GTO THYRISTOR

BACKGROUND OF THE INVENTION

1. Field of the Invention

The present invention relates to an insulated gate GTO thyristor.

2. Description of the Related Art

FIG. 16 is a sectional view showing a conventional insulated gate GTO thyristor. This structure is the same as that in FIG. 4 of U.S. Pat. No. 4,604,638. This insulated gate GTO thyristor has a pnpn structure constituted by a p+-type emitter layer 1, an n+-type buffer layer 2, an n-type base layer 3, a p-type base layer 4, and an n+-type emitter layer 5. An anode electrode 7 is formed on the surface of the p+-type emitter layer 1. A cathode electrode 8 is formed on the surface of the n+-type emitter layer 5. A p+-type layer 6 is formed in the p-type base layer 4, and a first gate electrode 9 is formed on the surface of the p+-type layer 6. A second gate electrode 11 is provided on the surface of the p-type base layer 4 between the n-type base layer 3 and the n+-type emitter layer 5 to be insulated by a gate insulating film 10.

A turn-ON operation of the insulated gate GTO thyristor will be described below. A positive voltage with respect to the cathode electrode 8 is applied to the first gate electrode 9 and the second gate electrode 11 when the thyristor is to be turned on. At this time, an inversion layer is formed in the surface portion of the p-type base layer 4 immediately below the gate insulating film 10 to form a channel, and electrons are injected from the n+-type emitter layer 5 into the n-type base layer 3 through the channel. When the electrons injected in the n-type base layer 3 reach the p+-type emitter layer 1, holes are injected from the p+-type emitter layer 1 to the n-type base layer 3. The holes are collected in the n+-type emitter layer 5 through the p-type base layer 4. As a result, electrons are directly injected from the n+-type emitter layer 5 to the p-type base layer 4, thereby turning on the element.

When the thyristor is to be turned off, a negative voltage with respect to the cathode electrode 8 is applied to the first gate electrode 9 and the second gate electrode 11. In this case, since the channels are lost and a reverse bias voltage is applied to a p-n junction between the n+-type emitter layer 5 and the p-type base layer 4, holes stored in the p-type and n-type base layers 3 and 4 are discharged to the base electrode 9, thereby turning off the element.

In order to improve the turn-OFF ability of the insulated gate GTO thyristor described above, an amount of base current extracted from the first gate electrode 9 in a turn-OFF operation must be increased. As one of methods of increasing the amount of base current, assuming that the sheet resistivity of the p-type base layer 4 is set to be $\rho s$ and the breakdown voltage of the emitter junction formed by the n-type emitter layer 5 and the p-type base layer 4 is set to be Vj, the value of $Vj/\rho s$ is increased.

The breakdown voltage Vj of the emitter junction is determined by the minimum breakdown voltage of three breakdown voltages at points indicated by symbols a, b, and c. In these breakdown voltages, the breakdown voltage at the point a is determined by a concentration distribution on the surface of the p-type base layer 4 of the channel portion and a concentration distribution on the surface of the n+-type emitter layer 5.

In order to increase these breakdown voltages, basically, concentrations of the n+-type emitter layer 5 and the p-type base layer 4 are decreased. However, the n+-type emitter layer 5 must have a high concentration to serve as an emitter, and the n+-type emitter layer 5 cannot have a low concentration.

On the other hand, since the p-type base layer 4 serves as a channel at the point a, the concentration of the p-type base layer 4 must be kept constant to hold an optimal threshold value. For this reason, the concentration of the p-type base layer 4 cannot be arbitrarily changed. In addition, as the concentration of the p-type base layer 4 is increased, its sheet resistivity $\rho s$ is decreased. Therefore, the p-type base layer 4 preferably has a high concentration to improve the turn-OFF ability. However, its concentration cannot be changed due to the above-described reason.

As described above, in the insulated gate GTO thyristor the concentrations of the n+-type emitter layer 5 and the p-type base layer 4 cannot be arbitrarily set. Therefore, the value of $Vj/\rho s$ cannot be increased, and a high turn-OFF ability is difficult to obtain.

SUMMARY OF THE INVENTION

It is an object of the present invention to provide an insulated gate GTO thyristor in which the value of $Vj/\rho s$ is increased without impairing other characteristics to increase a turn-OFF ability.

According to the present invention, there is provided an insulated gate GTO thyristor comprising:

a first emitter layer of a first conductivity type;

a first base layer of a second conductivity type contacting the first emitter layer;

a second base layer of the first conductivity type selectively formed in a surface of the first base layer;

a second emitter layer of the second conductivity type selectively formed in a surface of the second base layer;

a first main electrode formed in contact with the first emitter layer;

a second main electrode formed in contact with the second emitter layer;

a first gate electrode formed in contact with the second base layer; and a second gate electrode formed on a second base layer surface of a channel region between the second emitter layer and the first base layer through a gate insulating film, wherein, at a portion contacting at least the channel region, and the second emitter layer has a layer having a concentration lower than that of a portion immediately below the second main electrode.

According to the present invention, when an impurity concentration of the portion of the second emitter layer immediately below the second main electrode is set equal to that of a conventional device, a breakdown voltage of an emitter junction between the second emitter layer and the second base layer is increased to increase a value of $Vj/\rho s$. As a result, the turn-OFF ability of the insulated gate GTO thyristor can be effectively increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a sectional view showing an insulated gate GTO thyristor according to the fifth embodiment of the present invention;

FIG. 6 is a sectional view showing an insulated gate GTO thyristor according to the sixth embodiment of the present invention.

FIG. 13 is a sectional view showing an insulated gate GTO thyristor according to the thirteenth embodiment of the present invention;

FIG. 14 is a sectional view showing an insulated gate GTO thyristor according to the fourteenth embodiment of the present invention;

FIGS. 15A to 15I are sectional views showing the steps in manufacturing an insulated gate GTO thyristor according the present invention.

DETAILED DESCRIPTION OF THE PREFERRED EMBODIMENTS

Figure 1A:
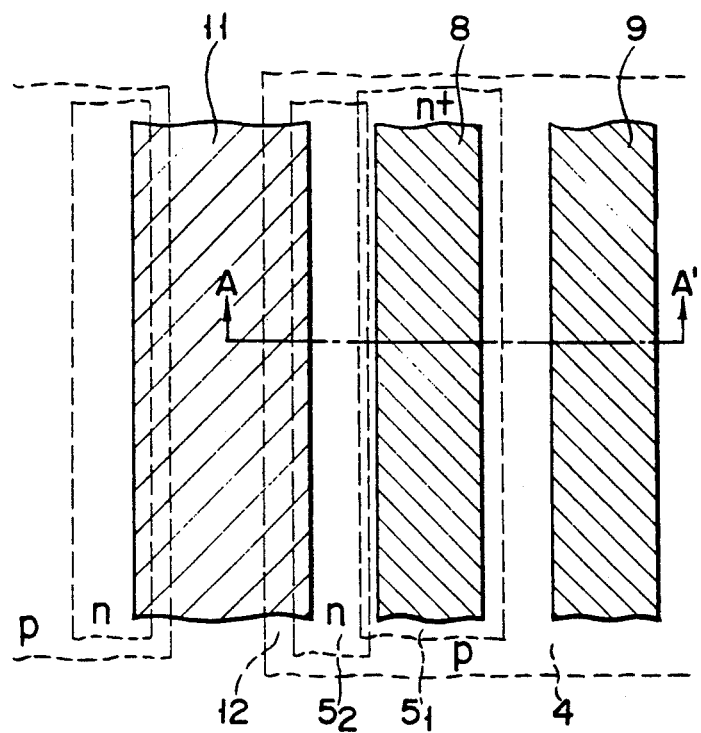
FIG. 1A is a view showing the layout of a main part of an insulated gate GTO thyristor according to the first embodiment of the present invention.
Figure 1B:
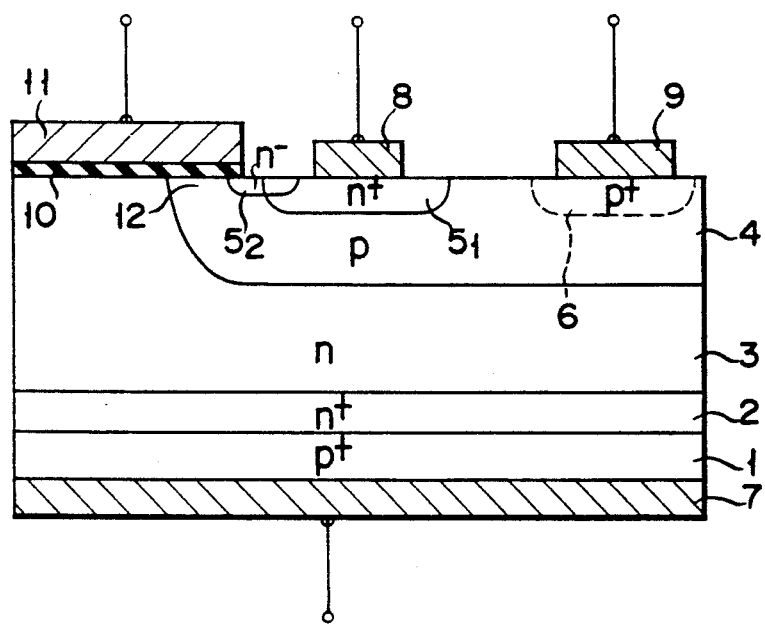
FIG. 1B is a sectional view showing the insulated gate GTO thyristor taken along a line A—A in FIG. 1A.

As shown in FIGS. 1A and 1B, an insulated gate GTO thyristor of the first embodiment has a pnpn structure constituted by a p-type emitter layer 1, an n-type buffer layer 2, an n-type base layer 3, a p-type base layer 4, and an n-type emitter layer 5. The p-type base layer 4 is selectively formed in the surface of the n-type base layer 3 in a stripe shape, and the n-type emitter layer 5 is selectively formed in the surface of the p-type base layer. In this embodiment, the n-type emitter layer 5 comprises a high-concentration first n-type layer ($n^+$-type layer) $5_1$ under a cathode electrode 8 and a low-concentration second n-type layer ($n^-$-type layer) $5_2$ contacting a channel region 12 under a second gate electrode 11. An anode electrode 7 is formed on the surface of the p-type emitter layer 1. A cathode electrode 8 is formed on the surface of the n-type emitter layer 5. A first gate electrode 9 is formed on the surface of the p-type base layer 4. The second gate electrode 11 is provided on the surface of the p-type base layer 4 between the n-type base layer 3 and the n-type emitter layer 5 to be insulated by a gate insulating film 10. A high-concentration $p^+$-type layer 6 is formed in the p-type base layer 4, and the first gate electrode 9 is formed in contact with the $p^+$-type layer 6.

An operation of the insulated gate GTO thyristor of this embodiment is the same as that of a conventional insulated gate GTO thyristor in FIG. 15. That is, a positive voltage with respect to the cathode electrode 8 is applied to the first gate electrode 9 and the second gate electrode 11 to perform a turn-ON operation, and a negative voltage with respect to the cathode electrode 8 is applied to the first gate electrode 9 and the second gate electrode 11 to perform a turn-OFF operation.

In the insulated gate GTO thyristor of this embodiment, a part of the n-type emitter layer 5 contacting the channel region 12 is constituted by the $n^-$-type layer $5_2$. According to this embodiment, an emitter junction breakdown voltage of the part contacting the channel region 12 which has a low breakdown voltage in a conventional structure is increased. Therefore, while the p-type base layer 4 of the channel region 12 is held at a concentration for obtaining a proper threshold value, the emitter junction breakdown voltage Vj can be increased. As a result, since the value of Vj/ρs is increased, the turn-OFF ability can be increased. In addition, the $n^-$-type layer $5_2$ is formed to be shallow, and a channel length can be appropriately set. Since the $n^+$-type layer $5_1$ is formed to be deep, an element having high injection efficiency and a low ON voltage can be obtained.

Figure 2:
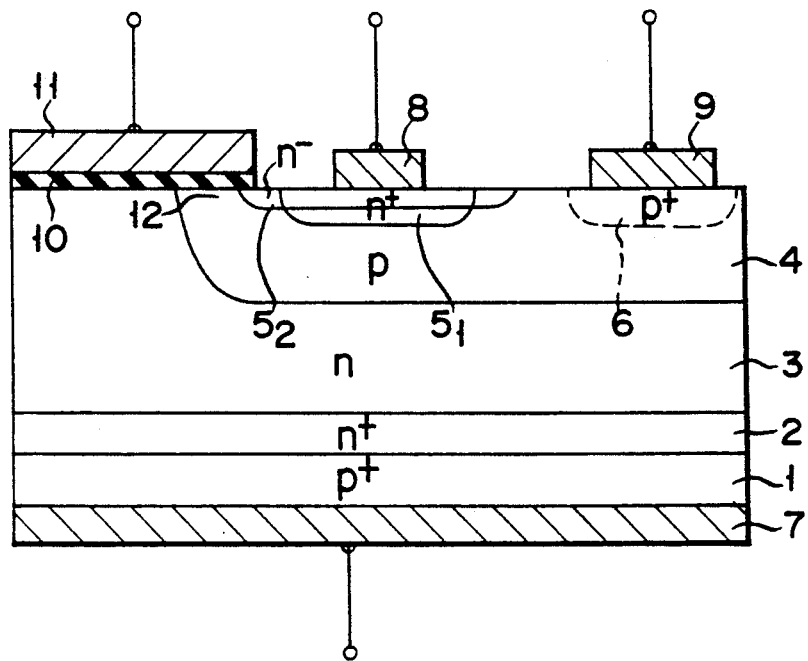
FIG. 2 is a sectional view showing an insulated gate GTO thyristor according to the second embodiment of the present invention.

FIG. 2 is a sectional view showing an element structure of an insulated gate GTO thyristor according to the second embodiment. In this embodiment, an $n^-$-type layer 5 is formed on not only a side contacting a channel region 12 but an opposite side, i.e., a first gate electrode 9 side. Practically, an $n^-$-type layer $5_2$ is formed by diffusion in a wide area including an area of an $n^+$-type layer $5_1$.

In the structure as described above, since an emitter junction breakdown voltage Vj can be increased even on a first gate electrode side, the turn-OFF ability can be further effectively increased.

Figure 3:
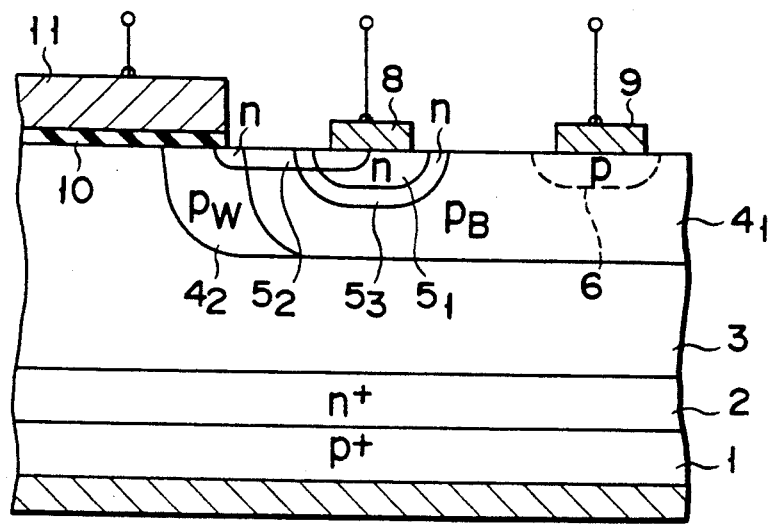
FIG. 3 is a sectional view showing an insulated gate GTO thyristor according to the third embodiment of the present invention.

FIG. 3 is a sectional view showing an element structure of an insulated gate GTO thyristor according to the third embodiment. In this embodiment, the p-type base layer 4 is composed of two p-type layers which have been formed in different steps. The first p-type layer $4_1$ is required for achieving thyristor operation. The second p-type layer $4_2$ has such a predetermined impurity concentration that it forms a channel region 12. The emitter layer 5 is composed of three n-type layers $5_1$, $5_2$, and $5_3$. The first n-type layer $5_1$ is deep and required for achieving thyristor operation. The second n-type layer $5_2$ connected to the first n-type layer $5_1$ to determined the channel length of the channel region 12 has a low impurity concentration. The third n-type layer $5_3$ is deep and surrounds the first n-type layer $5_1$. Since the second p-type layer $4_2$ is deep, the emitter junction can have a breakdown voltage higher than that of the first embodiment In addition, because of the provision of the third n-type layer $5_3$, the emitter junction in the thyristor section can have a breakdown voltage higher than that of the first embodiment.

Figure 4:
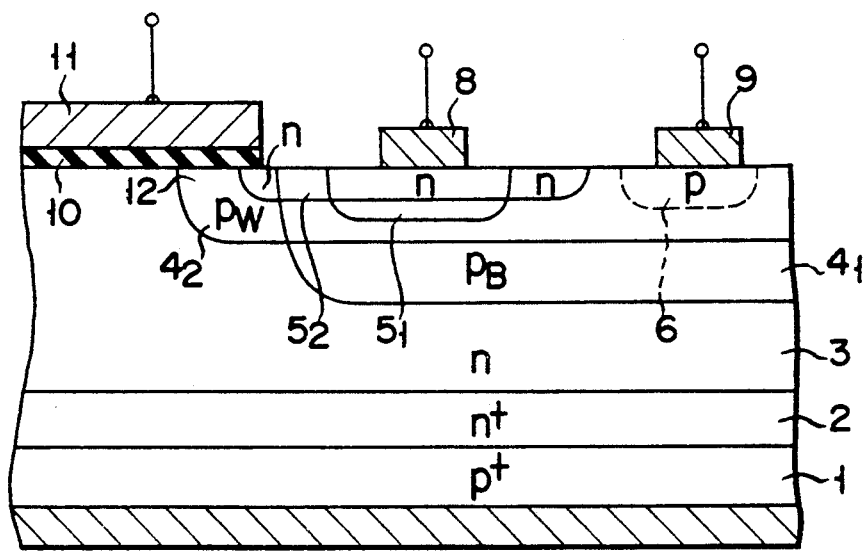
FIG. 4 is a sectional view showing an insulated gate GTO thyristor according to the fourth embodiment of the present invention.

FIG. 4 is a sectional view showing an element structure of an insulated gate GTO thyristor according to the fourth embodiment. In this embodiment, in a p-type base layer 4 in the structure in FIG. 2, a deep first p-type layer $4_1$ required for a thyristor operation and a shallow second p-type layer $4_2$ having a predetermined concentration required for forming a channel region 12 are formed in different manufacturing steps. Similarly, an n-type emitter layer 5 comprises a deep first n-type layer $5_1$ required for the thyristor operation and a shallow second n-type layer $5_2$ connected to the first n-type layer $5_1$ to determine the length of the channel region 12. More specifically, the p-type layer $4_2$ and the n-type layer $5_2$ are self-aligned by impurity diffusion using a second gate electrode 11 as a mask and have a so-called DSA structure. In this case, the first n-type layer $5_1$ has, e.g., a depth of 1 to 3 $\mu$m at a dose of $5 \times 10^{15}/cm^2$, and the second n-type layer $5_2$ has a depth of about 0.2 to 1 $\mu$m at a dose of $1 \times 10^{15}$ to $2 \times 10^{15}/cm^2$. The surface concentration of the first n-type emitter layer $5_1$ may be lower than that of the second n-type emitter layer $5_2$.

According to this embodiment, the depth or lateral resistance of the p-type base layer $4_1$ at a thyristor portion can be optimized independently of the p-type base layer $4_2$ at the channel region 12 portion. In other words, the concentration or channel length of the p-type base layer $4_2$ at the channel region 12 portion can be optimally set independently of that of p-type base layer $4_1$ at the thyristor portion.

FIG. 5 is a sectional view showing an element structure of an insulated gate GTO thyristor according to the fifth embodiment. According to this embodiment, an $n^-$-type layer $5_2$ is formed to have a depth larger than that of an $n^+$-type layer $5_1$ on the basis of the element structure in FIG. 1.

With the above structure, the concentration of a p-type base layer 4 near a flat junction portion of the $n^-$-type layer $5_2$ is decreased. Therefore, the emitter junction breakdown voltage at the flat junction portion is increased. Since an overlapping portion between the $n^-$-type layer $5_2$ and the $n^+$-type layer $5_1$ is formed in a p-type base layer 4 at a deep portion, the turn-OFF ability can be further increased.

FIG. 6 is a sectional view showing an element structure of an insulated gate GTO thyristor according to the sixth embodiment. In this embodiment, an $n^+$-type layer $5_1$ is formed within an $n^-$-type layer $5_2$. With this structure, since any junction between the $n^+$-type layer $5_1$ and a p-type base layer 4 is not formed, an emitter junction is only a junction between the p-type base layer 4 and $n^-$-type layer $5_2$. Therefore, the turn-OFF ability is further increased.

Figure 7:
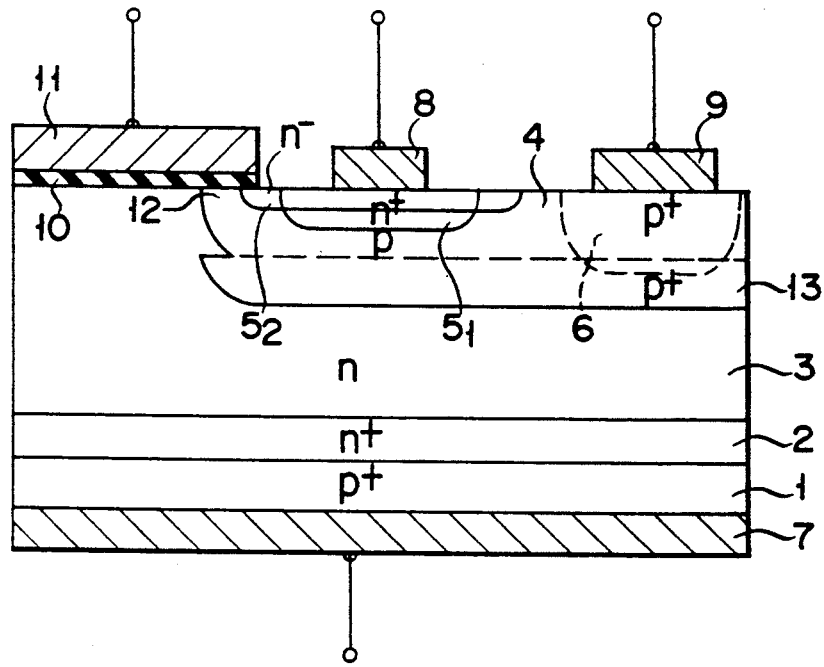
FIG. 7 is a sectional view showing an insulated gate GTO thyristor according to the seventh embodiment of the present invention.

FIG. 7 is a sectional view showing an element structure of an insulated gate GTO thyristor according to the seventh embodiment. In this embodiment, a high-concentration $p^+$-type layer 13 is buried and formed in a lower portion of the p-type base layer 4 of the insulated gate GTO thyristor according to the second embodiment. A $p^+$-type layer 6 immediately below a first gate electrode 9 is formed deep by diffusion to be in contact with a $p^+$-type layer 13 buried in a lower portion of the p-type base layer 4.

With this structure, the sheet resistivity $\rho s$ of the p-type base layer 4 can be substantially decreased without changing the concentration of a channel region 12 That is, the sheet resistivity $\rho s$ is decreased to increase a value of $Vj/\rho s$, and the turn-OFF ability can be further increased. In addition, since the $p^+$-type layer 6 is in contact with the $p^+$-type buried layer 13, the resistance of base current extraction is small.

Figure 8:
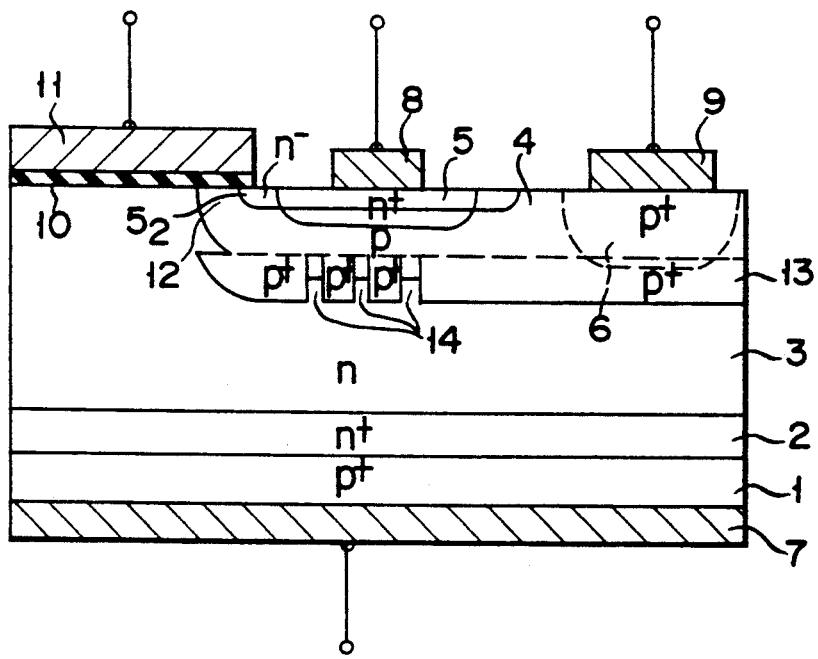
FIG. 8 is a sectional view showing an insulated gate GTO thyristor according to the eighth embodiment of the present invention.
Figure 9:
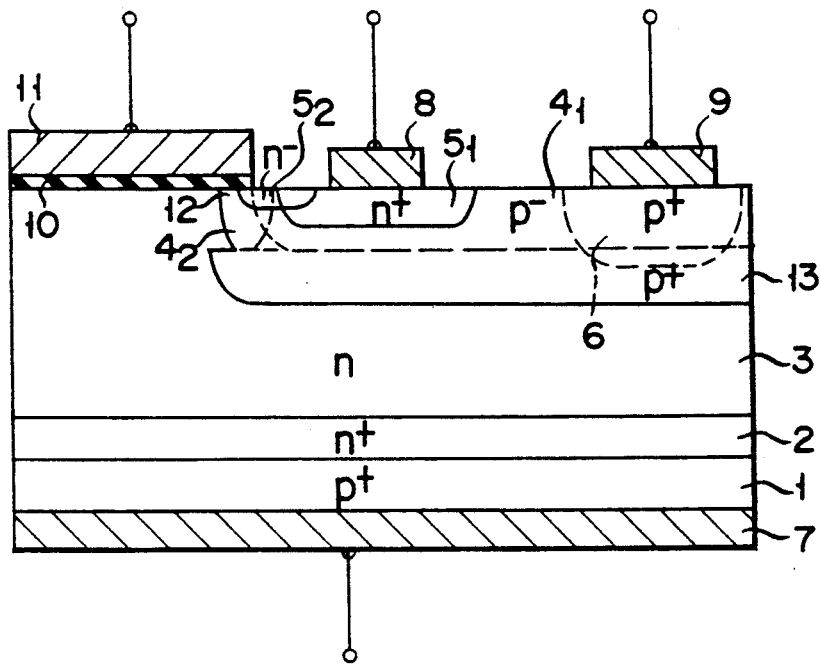
FIG. 9 is a sectional view showing an insulated gate GTO thyristor according to the ninth embodiment of the present invention.
Figure 10:
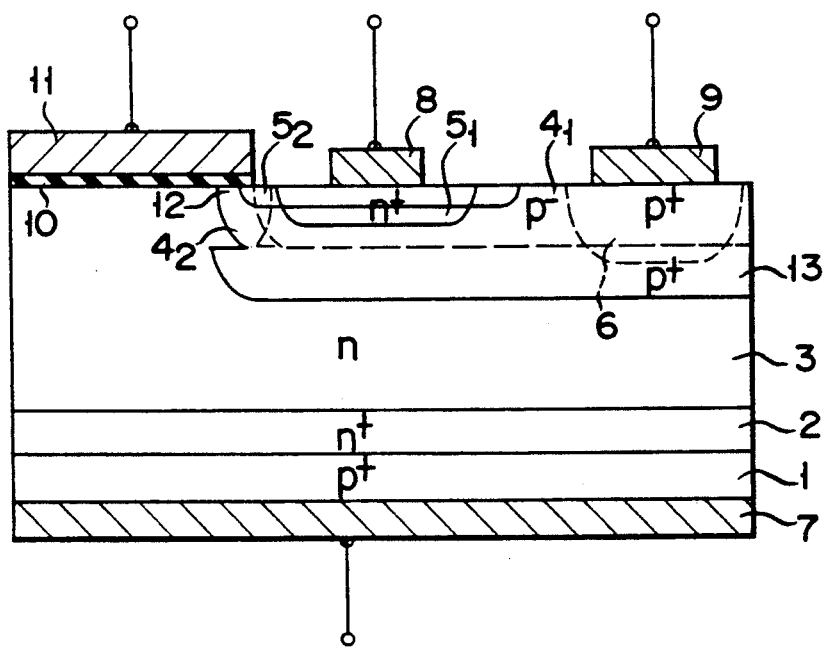
FIG. 10 is a sectional view showing an insulated gate GTO thyristor according to the tenth embodiment of the present invention.
Figure 11:
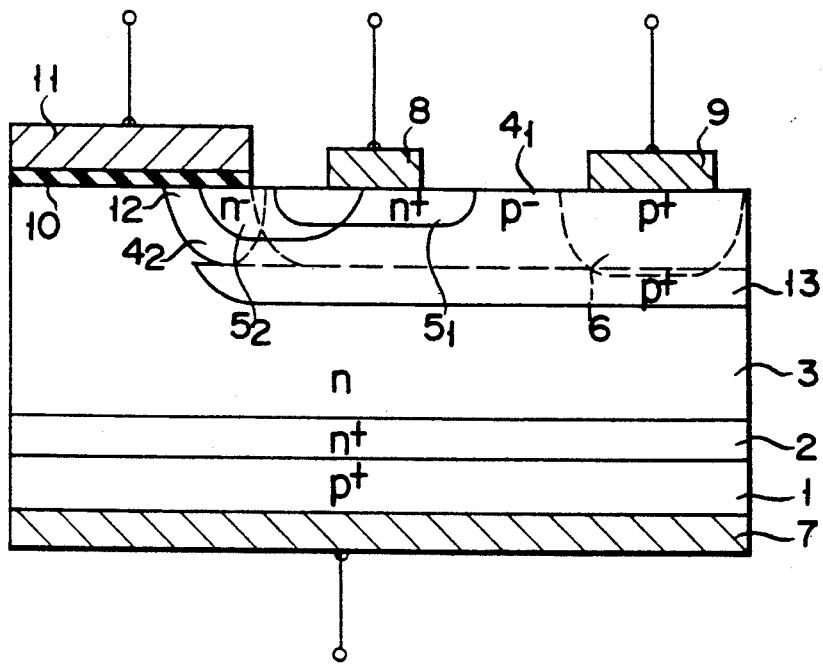
FIG. 11 is a sectional view showing an insulated gate GTO thyristor according to the eleventh embodiment of the present invention.
Figure 12:
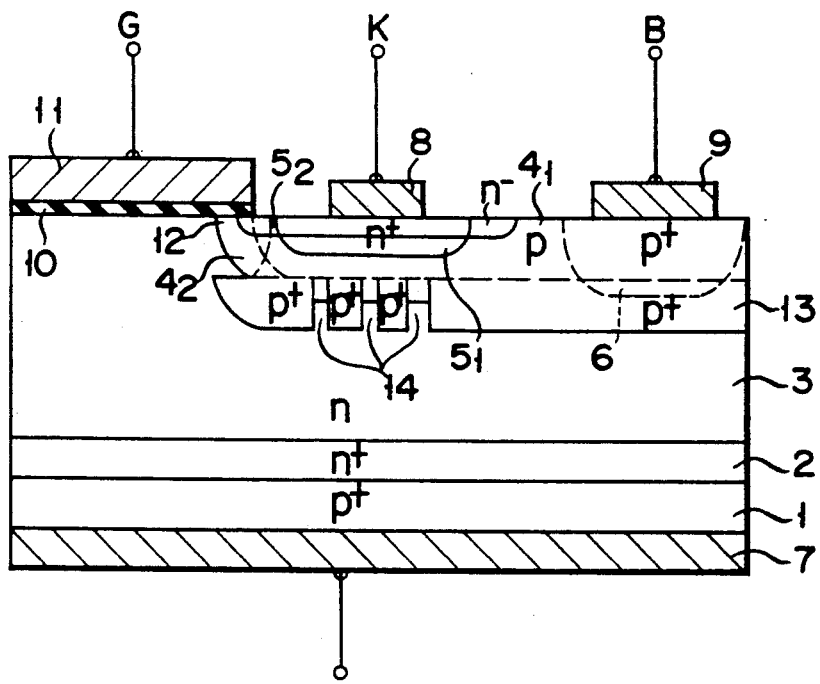
FIG. 12 is a sectional view showing an insulated gate GTO thyristor according to the twelfth embodiment of the present invention.
Figure 16:
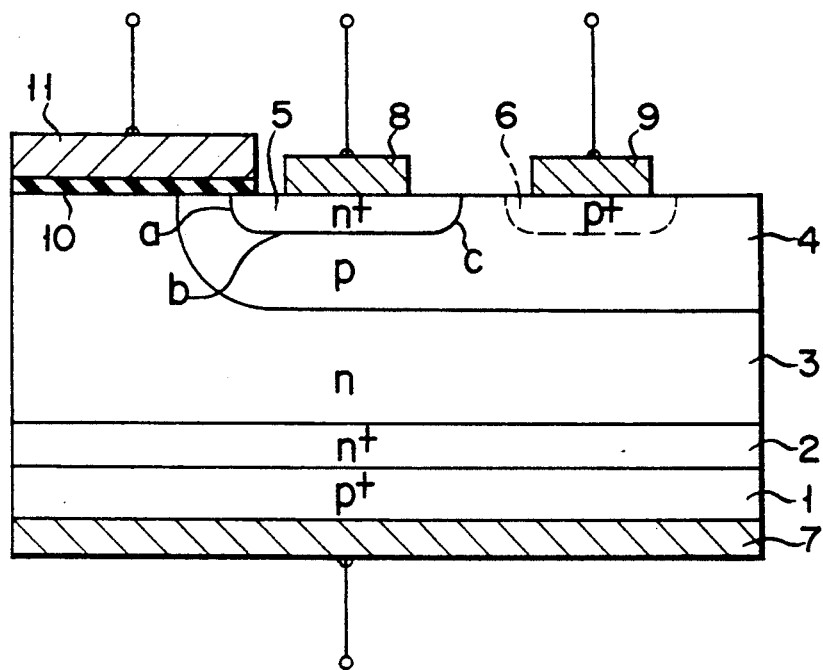
FIG. 16 is a sectional view showing a conventional insulated gate GTO thyristor.

FIG. 8 is a sectional view showing an element structure of an insulated gate GTO thyristor according to the eighth embodiment. In this embodiment, a junction portion 14 between a p-type base layer 4 and an n-type base layer 3 is formed using the $p^+$-type buried layer 13 (FIG. 7) immediately below the n-type emitter layer 5 as a matrix pattern.

With this structure, even when the concentration of the $p^+$-type layer 13 is set to be higher than that in the seventh embodiment, an anode current flows in the portion 14. Therefore, an increase in ON voltage can be suppressed. In addition, since the same effect as obtained when the sheet resistivity $\rho s$ of the p-type base layer 4 is decreased can be obtained, a higher turn-OFF ability can be obtained.

FIGS. 9 to 12 are sectional views showing element structures of insulated gate GTO thyristors according to the ninth to twelfth embodiments. These embodiments are obtained by modifying the first, second, fifth, and eighth embodiments, respectively.

In the ninth, tenth, and eleven embodiments, the seventh embodiment is respectively combined with the first, second, and fifth embodiments to obtain basic structures. In addition to such a basic structure, each p-type base layer 4 portion is formed by a p-type layer $4_2$ on which a channel region 12 is formed, and a $p^-$-type layer $4_1$ having a concentration lower than that of the p-type layer $4_2$.

With each of these structures in FIGS. 9 to 12, an $n^+$-type layer $5_1$ and an $n^-$-type layer $5_2$ are in contact with the low-concentration $p^-$-type layer $4_1$ except for a portion contacting the channel region 12. The emitter junction breakdown voltage Vj is further increased.

FIG. 13 is a sectional view showing an element structure of an insulated gate GTO thyristor according to the thirteenth embodiment. In this embodiment, an $n^+$-type layer $5_1$ is formed by diffusion in an n-type emitter layer 5 at only a portion contacting a cathode electrode 8 using an $n^-$-type layer $5_2$ as an epitaxially grown layer. An $n^+$-type floating diffusion layer 15 is formed at the center of a $p^-$-type base layer 4, and a channel region 12 is divided into channel regions $12_1$ and $12_2$ by the $n^+$-type diffusion layer 15. Two divided second gate electrodes 11-1 and 11-2 are formed on these channel regions $12_1$ and $12_2$ to be insulated by a gate insulating film 10. When the entire surface portion of the $p^-$-type base layer 4 formed by diffusion is used as a channel region 12, the channel length is too long. As described above, when the channel region is divided by the floating diffusion layer 15, a substantially short channel can be obtained. Therefore, the high turn-ON ability can be obtained. In addition, with the above structure, the two channel regions $12_1$ and $12_2$ can be easily operated at different timings.

When the channel regions $12_1$ and $12_2$ are operated at different timings, two advantages result in. The first advantage is that the GTO thyristor has a high Vj. The second advantage is that the GTO thyristor has a high turn-OFF ability when operating in the so-called "IGBT mode."

More specifically, the second channel region $12_2$ is eliminated, and then a voltage is applied to the first gate electrode 9, said voltage being negative with respect to that applied to the cathode electrode 8. Thereafter, the first channel region $12_1$ is eliminated. The moment the channel region $12_2$ is eliminated, the floating layer 15 is electrically isolated from the n-type emitter layer 5. Hence, when the negative voltage is applied to the first gate electrode 9, the depletion layer expands within the low-concentration n-type emitter layer $5_2$, increasing the voltage Vj greatly.

Even if the channel region $12_2$ is eliminated, a channel is formed in the channel region $12_1$, which connects the floating layer 15 to the n-type base layer. Hence, electrons in the n-type emitter layer 5, pass through the low-concentration p-type base layer, and are injected into the n-type base layer 3 via the floating layer 15 and the channel region $12_1$. In the meantime, holes are drained away through the high-concentration p-type layer 13 to the first gate electrode 9 to which the negative voltage is applied. At this time, most of the current is flowing into the n-type emitter layer $5_1$. The holes existing below this layer $5_1$ are drained to the first gate electrode 9. As a result, the GTO thyristor is turned off in the IGBT mode, and has a high turn-OFF ability.

The same gate arrangement as described above can be applied to the embodiments in FIGS. 1 to 12, thereby increasing the turn-ON ability.

FIG. 14 is a sectional view showing an element structure of the fourteenth embodiment in which the present invention is applied to a V-MOS gate GTO thyristor. In this case, a $p^-$-type base layer 4 and an $n^-$-type layer $5_2$ are formed by an epitaxial growing method. A V-groove is formed on the epitaxial wafer, and a channel region 12 is formed in the V-groove. According to this embodiment, a channel resistance under a second gate electrode can be sufficiently decreased. The V-groove can be replaced by an U-groove or other trench.

FIGS. 15A to 15I are sectional views showing the steps in manufacturing an insulated gate GTO thyristor of the present invention. As shown in FIG. 15A, as in the step in manufacturing a conventional MOS gate GTO thyristor, an $n^+$-type buffer layer 2 and a $p^+$-type emitter layer 1 are sequentially formed on an $n^-$-type base layer 3. At this time, the $n^+$-type buffer layer 2 have an average concentration of $1 \times 10^{14}/cm^3$ or more and a thickness of 10 μm or more. Therefore, a depletion layer is prevented from being reached in the $p^+$-type emitter layer 1. In addition, the thickness of the $n^-$-type base layer 3 can be reduced to ⅔ to decrease the ON voltage of the element without decreasing a forward blocking voltage.

As shown in FIG. 15B, a first groove 17 is formed in the surface of the $n^-$-type base layer 3. As shown in FIG. 15C, a $p^+$-type layer 13 is bridged over a part of the first groove 17 and the surface of the $n^-$-type base layer 3.

As shown in FIG. 15D, a $p^-$-type base layer 4 is bridged over a region of the first groove 17 not having the $p^+$-type layer 13 and the surface of $n^-$-type base layer 3. An $n^-$-type layer $5_2$ is formed by an epitaxial growing method or the like, and the first groove 17 is buried as shown in FIG. 15E.

As shown in FIG. 15F, after a $p^-$-type layer 16 is formed in the $n^-$-type layer $5_2$ to reach the $p^+$-type layer 13, an $n^+$-type layer $5_1$ is formed to cover the $p^-$-type layer 16, as shown in FIG. 15G. In this case, the $p^-$-type layer 16 is formed to inject many electrons from the $n^+$-type layer 5 when the thyristor is to be turned on.

As shown in FIG. 15H, a second groove 18 is formed such that a portion of the $p^-$-type base layer 4 formed on the side surface of the first groove 17 is exposed. Finally, as shown in FIG. 15I, an anode electrode 7, a cathode electrode 8, a first gate electrode 9, a gate insulating film 10, and the second gate electrode 11 are sequentially formed, thus completing an insulated gate GTO thyristor.

As described above, according to the present invention, since an emitter junction breakdown voltage can be increased without decreasing the concentration of a base layer of a first conductivity type, the turn-OFF ability can be extremely increased. Therefore, an insulated gate GTO thyristor capable of being turned on in response to the same IC output as in a conventional thyristor in a turn-ON operation, receiving a high voltage which cannot be applied to a conventional element in a turn-OFF operation, and being turned off at a high speed can be obtained. In the above embodiments, p-type and n-type can be replaced each other.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An insulated gate GTO thyristor comprising:
   a first emitter layer of a first conductivity type;
   a first base layer of a second conductivity type contacting said first emitter layer;
   a second base layer of the first conductivity type in said first base layer, said second base layer having a surface portion which is not in contact with said first base layer;
   a second emitter layer of the second conductivity type which is not in contact with the first base layer and defining a channel region of the second base layer as a region of the second base layer which is between said first base layer and said second emitter layer;
   a first main electrode coupled with said first emitter layer;
   a second main electrode coupled with said second emitter layer;
   a first gate electrode arranged on said surface portion of said second base layer;
   a second gate electrode insulatively disposed above said channel region; and
   said second emitter layer comprising a first impurity doped layer immediately below said second main electrode, and a second impurity doped layer smaller in dopant concentration than said first impurity doped layer, said second impurity doped layer being arranged to partially overlap said first impurity doped layer and said channel region.

2. An insulated gate GTO thyristor according to claim 1, wherein said second impurity doped layer is smaller in depth than said first impurity doped layer.

3. An insulated gate GTO thyristor according to claim 1, wherein said second impurity doped layer is greater in area than said first impurity doped layer.

4. An insulated gate GTO thyristor according to claim 1, wherein said second impurity doped layer is greater in depth than said first impurity doped layer.

5. An insulated gate GTO thyristor according to claim 1, wherein said second base layer comprises an impurity doped semiconductor layer arranged to include therein said second emitter layer and exclude said channel region, and another impurity doped semiconductor layer arranged to include therein said second emitter layer and said channel region.

6. An insulated gate GTO thyristor according to claim 1, wherein said second base layer comprises:
an impurity doped semiconductor layer arranged to include therein said second emitter layer and said channel region, and having a bottom portion; and
another impurity doped semiconductor layer having a dopant concentration higher than that of said impurity doped semiconductor layer and being buried in the bottom portion of said impurity doped semiconductor layer.

7. An insulated gate GTO thyristor according to claim 6, wherein said another impurity doped semiconductor layer has a matrix pattern under said first main electrode.

8. An insulated gate GTO thyristor according to claim 1, wherein said second base layer includes:
a first impurity doped semiconductor layer including therein said second emitter layer,
a second impurity doped semiconductor layer being greater in dopant concentration than said first impurity doped semiconductor layer formed in a region for forming said channel region, and
a third impurity doped semiconductor layer buried in a bottom portion of the first and second impurity doped semiconductor layers.

9. An insulated GTO thyristor according to claim 1, wherein said second emitter layer includes an epitaxial layer and an impurity doped layer arranged in a limited region for forming said second main electrode, and wherein said second base layer includes a first impurity doped sublayer buried between said epitaxial layer and said first base layer, and a second impurity doped sublayer being in lateral contact with said epitaxial layer and deep enough to reach said first impurity doped layer.

10. An insulated gate GTO thyristor according to claim 9, further comprising a floating layer of the second conductivity arranged in said second impurity doped sublayer to define spaced part surface portions of said second impurity doped sublayer as channel regions, and wherein said second gate electrode is divided into electrode sections overlying said channel regions.

11. An insulated gate GTO thyristor according to claim 10, further comprising means for causing one of said channel region which is adjacent to said second emitter layer to turn off, and for providing said first gate electrode with a voltage of negative polarity with respect to that of said second main electrode so that another one of said channel regions which is adjacent to said first base layer is then turned off.

12. An insulated gate GTO thyristor according to claim 1, wherein said first base layer, said second base layer and said second impurity doped layer have a groove of a "V"- or "U"-shaped profile with side walls on which said channel region and said second gate electrode are formed.

13. An insulated gate GTO thyristor comprising:
a first emitter layer of a first conductivity type;
a first base layer of a second conductivity type contacting said first emitter layer;
a second base layer of the first conductivity type in said first base layer, said second base layer having a surface portion which is not in contact with said first base layer;
a second emitter layer of the second conductivity type which is not in contact with the first base layer and defining a channel region in the second base layer as a region of the second base layer which is between said first base layer and said second emitter layer;
a first main electrode being in contact with said first emitter layer;
a second main electrode being in contact with said second emitter layer;
a first gate electrode being in contact with said second base layer;
a dielectric film on said channel region;
a second gate electrode on said film; and
said second emitter layer comprising a first impurity doped layer immediately below said second main electrode, and a second impurity doped layer which partially overlaps said channel and said first impurity doped layer at a portion of said first impurity doped layer contacting at least said channel region, and which is smaller in depth than said first impurity doped layer.

14. An insulated gate GTO thyristor according to claim 13, wherein said second base layer comprises an impurity doped semiconductor layer having a depth required for a thyristor operation, and another impurity doped semiconductor layer which overlaps said first impurity doped layer and has a depth smaller than that of said first impurity doped layer, said another impurity doped semiconductor layer having a surface portion serving as said channel region.

* * * * *